United States Patent
Yazovitsky et al.

(10) Patent No.: US 10,755,787 B2
(45) Date of Patent: Aug. 25, 2020

(54) EFFICIENT POST PROGRAMMING VERIFICATION IN A NONVOLATILE MEMORY

(71) Applicant: Apple Inc., Cupertino, CA (US)

(72) Inventors: Eli Yazovitsky, Netanya (IL); Assaf Shappir, Ganey Tikva (IL); Itay Sagron, Gedera (IL); Meir Dalal, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/202,127

(22) Filed: Nov. 28, 2018

(65) Prior Publication Data
US 2020/0005873 A1    Jan. 2, 2020

Related U.S. Application Data

(60) Provisional application No. 62/690,974, filed on Jun. 28, 2018.

(51) Int. Cl.
| | |
|---|---|
| *G11C 16/10* | (2006.01) |
| *G11C 16/14* | (2006.01) |
| *G11C 16/26* | (2006.01) |
| *G11C 29/52* | (2006.01) |
| *G06F 11/10* | (2006.01) |
| *G11C 29/12* | (2006.01) |

(52) U.S. Cl.
CPC ......... *G11C 16/105* (2013.01); *G06F 11/108* (2013.01); *G06F 11/1072* (2013.01); *G11C 16/14* (2013.01); *G11C 16/26* (2013.01); *G11C 29/12* (2013.01); *G11C 29/52* (2013.01); *G11C 2029/1202* (2013.01)

(58) Field of Classification Search
CPC .................................................. G06F 12/0246
See application file for complete search history.

(56) References Cited

U.S. PATENT DOCUMENTS

| | | |
|---|---|---|
| 4,841,482 A | 6/1989 | Kreifels |
| 5,181,025 A | 1/1993 | Ferguson et al. |
| (Continued) | | |

OTHER PUBLICATIONS

Shappir et al., U.S. Appl. No. 16/202,130, filed Nov. 28, 2018.
U.S. Appl. No. 16/202,130 office action dated Jan. 8, 2020.

*Primary Examiner* — Edward J Dudek, Jr.
(74) *Attorney, Agent, or Firm* — Kligler & Associates Patent Attorneys Ltd

(57) ABSTRACT

A storage device includes storage circuitry and multiple memory cells. The memory cells are organized in multiple memory blocks of a nonvolatile memory. The storage circuitry is configured to define a partial verification scheme that specifies testing only a data portion of the data programmed to the memory blocks, to program data to a memory block, calculate redundancy data over the data, and save the calculated redundancy data in a dedicated memory, to verify that the data portion specified for the memory block in the partial verification scheme has been programmed successfully, to check a predefined condition for conditionally performing full verification to the memory block, when the predefined condition is fulfilled, to verify that data programmed to the memory block and not tested using the partial verification scheme has been programmed successfully, and to recover, using the redundancy data, at least part of the data programmed that failed verification.

20 Claims, 3 Drawing Sheets

(56) References Cited

U.S. PATENT DOCUMENTS

| | | |
|---|---|---|
| 5,331,594 A | 7/1994 | Hotta |
| 5,372,712 A | 12/1994 | Petit |
| 5,428,621 A | 6/1995 | Mehrotra et al. |
| 5,440,516 A | 8/1995 | Slemmer |
| 5,581,509 A | 12/1996 | Golla et al. |
| 5,602,778 A | 2/1997 | Futatsuya et al. |
| 5,606,527 A | 2/1997 | Kwack et al. |
| 5,684,747 A | 11/1997 | Urai |
| 5,748,545 A | 5/1998 | Lee et al. |
| 5,796,653 A | 8/1998 | Gaultier |
| 5,847,995 A | 12/1998 | Kobayashi et al. |
| 5,898,637 A | 4/1999 | Lakhani et al. |
| 6,031,772 A | 2/2000 | Nagatomo |
| 6,545,910 B2 | 4/2003 | Byeon et al. |
| 6,650,585 B2 | 11/2003 | Chevallier |
| 6,707,078 B1 | 3/2004 | Shiraiwa et al. |
| 6,813,183 B2 | 11/2004 | Chevallier |
| 7,089,460 B2 | 8/2006 | Fu |
| 7,212,454 B2 | 5/2007 | Kleveland et al. |
| 7,319,623 B1 | 1/2008 | Yuan et al. |
| 7,440,347 B1 | 10/2008 | Vogelsang |
| 7,463,529 B2 | 12/2008 | Matsubara |
| 7,856,528 B1 | 12/2010 | Frost et al. |
| 7,873,803 B2 | 1/2011 | Cheng |
| 8,176,284 B2 | 5/2012 | Frost et al. |
| 8,305,807 B2 | 11/2012 | Shah et al. |
| 8,379,454 B2 | 2/2013 | Kochar et al. |
| 8,432,732 B2 | 4/2013 | Li et al. |
| 8,473,780 B2 | 6/2013 | Shalvi |
| 8,478,796 B2 | 7/2013 | Post et al. |
| 8,514,630 B2 | 8/2013 | Huynh et al. |
| 8,645,749 B2 | 2/2014 | Reche |
| 8,645,776 B2 | 2/2014 | Byom et al. |
| 8,730,722 B2 | 5/2014 | Koh et al. |
| 8,732,557 B2 | 5/2014 | Ratnam et al. |
| 8,767,459 B1 | 7/2014 | Kasorla et al. |
| 8,775,901 B2 | 7/2014 | Sharon et al. |
| 8,832,357 B2 | 9/2014 | Yao et al. |
| 8,892,981 B2 | 11/2014 | Post et al. |
| 8,902,657 B2 | 12/2014 | Iwai et al. |
| 8,977,813 B2 | 3/2015 | Burd |
| 9,021,339 B2 | 4/2015 | Lu et al. |
| 9,021,343 B1 | 4/2015 | Hu et al. |
| 9,032,272 B2 | 5/2015 | Yoon et al. |
| 9,053,809 B2 | 6/2015 | Anholt et al. |
| 9,058,261 B1 | 6/2015 | Jean et al. |
| 9,092,363 B2 | 7/2015 | Avila et al. |
| 9,105,349 B2 | 8/2015 | Avila et al. |
| 9,128,822 B2 | 9/2015 | Michael et al. |
| 9,135,112 B2 | 9/2015 | Chen et al. |
| 9,177,610 B2 | 11/2015 | D'Abreu et al. |
| 9,330,783 B1 | 5/2016 | Rotbard et al. |
| 9,355,713 B2 | 5/2016 | Huang et al. |
| 9,390,809 B1 | 7/2016 | Shur et al. |
| 9,406,346 B2 | 8/2016 | D'Abreu et al. |
| 9,454,429 B2 | 9/2016 | Ojalvo et al. |
| 9,489,263 B2 | 11/2016 | Hyun et al. |
| 9,529,663 B1 | 12/2016 | Srinvasan et al. |
| 9,619,321 B1 | 4/2017 | Haratsch et al. |
| 9,811,413 B2 | 11/2017 | Ojalvo et al. |
| 9,959,168 B2 | 5/2018 | Achtenberg et al. |
| 9,984,771 B2 | 5/2018 | Bonke |
| 9,996,417 B2 | 6/2018 | Shappir et al. |
| 2002/0174295 A1 | 11/2002 | Ulrich et al. |
| 2008/0052446 A1 | 2/2008 | Lasser et al. |
| 2009/0225607 A1 | 9/2009 | Chen et al. |
| 2010/0128525 A1 | 5/2010 | Mokhlesi |
| 2010/0329052 A1 | 12/2010 | Chen et al. |
| 2011/0066793 A1 | 3/2011 | Burd |
| 2011/0209028 A1 | 8/2011 | Post et al. |
| 2012/0159281 A1 | 6/2012 | Shalvi et al. |
| 2013/0024748 A1 | 1/2013 | Sharon et al. |
| 2013/0031429 A1 | 1/2013 | Sharon et al. |
| 2013/0117606 A1 | 5/2013 | Anholt et al. |
| 2013/0229868 A1 | 9/2013 | Koh et al. |
| 2013/0268724 A1 | 10/2013 | Seo et al. |
| 2013/0294168 A1 | 11/2013 | Shirakawa |
| 2014/0047291 A1 | 2/2014 | Shalvi et al. |
| 2014/0095259 A1 | 3/2014 | Tam et al. |
| 2014/0157078 A1 | 6/2014 | Danilak et al. |
| 2014/0189421 A1 | 7/2014 | Werner et al. |
| 2014/0189438 A1 | 7/2014 | Arbel et al. |
| 2014/0254264 A1 | 9/2014 | Dutta et al. |
| 2014/0269071 A1 | 9/2014 | Pandya et al. |
| 2014/0321202 A1 | 10/2014 | Yang et al. |
| 2015/0154069 A1 | 6/2015 | Tuers et al. |
| 2015/0178150 A1 | 6/2015 | Silberman et al. |
| 2016/0034353 A1 | 2/2016 | Tuers et al. |
| 2016/0098216 A1* | 4/2016 | Huang ............... G06F 11/1072 714/37 |
| 2019/0095116 A1 | 3/2019 | Igahara et al. |
| 2019/0198113 A1* | 6/2019 | Ben-Rubi ........... G11C 11/5628 |
| 2019/0317672 A1* | 10/2019 | Linnen ................ G06F 3/0616 |

* cited by examiner

US 10,755,787 B2

EFFICIENT POST PROGRAMMING VERIFICATION IN A NONVOLATILE MEMORY

CROSS-REFERENCE TO RELATED APPLICATIONS

This application claims the benefit of U.S. Provisional Patent Application 62/690,974, filed Jun. 28, 2018, whose disclosure is incorporated herein by reference.

TECHNICAL FIELD

Embodiments described herein relate generally to data storage, and particularly to methods and systems for verifying successful programming in a nonvolatile memory.

BACKGROUND

Non-Volatile Memory (NVM) devices are subject to various failures, e.g., due to imperfect manufacturing process. Such failures include, for example, word-line to substrate and word-line to word-line short-circuit or leakage, which may result in data loss in programming, reading or both.

Methods for post programming verification in NVM devices are known in the art. For example, U.S. Pat. No. 9,330,783, whose disclosure is incorporated herein by reference, describes an apparatus that includes a memory and a memory controller. The memory includes a memory block that includes memory cells connected by word lines. The memory controller is configured to store data in the memory cells, and to identify a suspected short-circuit event in the memory block by recognizing a deviation of a performance characteristic of at least a given word line in the memory block relative to the performance characteristic of remaining word lines in the memory block.

SUMMARY

An embodiment that is described herein provides a storage device that includes storage circuitry and multiple memory cells. The memory cells are organized in multiple memory blocks of a nonvolatile memory. The storage circuitry is configured to define a partial verification scheme that specifies testing only a data portion of the data programmed to the memory blocks, to program data to a memory block, calculate redundancy data over the data, and save the calculated redundancy data in a dedicated memory, to verify that the data portion specified for the memory block in the partial verification scheme has been programmed successfully, to check a predefined condition for conditionally performing full verification to the memory block, when the predefined condition is fulfilled, to verify that data programmed to the memory block and not tested using the partial verification scheme has been programmed successfully, and to recover, using the redundancy data, at least part of the data programmed that failed verification.

In some embodiments, the storage circuitry is configured to define the partial verification scheme by excluding from testing data programmed to at least one of: a Word Line (WL) of the memory cells, a data page of a given bit significance, a string in a Three Dimensional (3D) configuration of the memory cells, and a Code Word calculated prior to programming using an Error Correction Code (ECC). In other embodiments, the storage circuitry is configured to encode the data prior to programming in accordance with a predefined ECC, and to verify that the data has been programmed successfully by reading the programmed data and verifying that the read data decodes successfully in accordance with the predefined ECC. In yet other embodiments, the storage circuitry is configured to check the condition by measuring execution times of at least one of erasure and programming operations applied to the memory block, calculating a performance metric based on the measured execution times, and deciding that the condition is fulfilled when the performance metric exceeds a predefined performance threshold.

In an embodiment, the storage circuitry is configured to check the condition by calculating a likelihood metric indicative of a likelihood that at least some of the data programmed to the memory block that is not specified within the data portion has been corrupted, and deciding that the condition is fulfilled when the likelihood metric exceeds a predefined likelihood level. In another embodiment, the storage circuitry is configured to calculate the likelihood metric by identifying erroneous bits in the data portion, classifying the erroneous bits to multiple severity categories, and calculating a likelihood metric based on a distribution of the erroneous bits among the severity categories. In yet another embodiment, the storage circuitry is configured to calculate the likelihood metric by evaluating error counts of the erroneous bits in the respective severity categories, and calculating a weighted sum of the error counts using predefined weights assigned respectively to the severity categories.

In some embodiments, the storage circuitry is configured to identify the erroneous bits by reading the data portion using multiple read thresholds to produce multiple respective read outcomes, and applying soft decoding to the data portion using soft information derived from the multiple read outcomes. In other embodiments, the storage circuitry is configured to identify the erroneous bits by applying coarse soft decoding to at least part of the data portion based on a first number of read outcomes, and when the coarse soft decoding fails, applying fine soft decoding to the at least part of the data portion based on a second number of read outcomes larger than the first number. In yet other embodiments, the storage circuitry is configured to identify at least some of the erroneous bits by identifying erased memory cells whose threshold voltages exceed a predefined threshold voltage.

In an embodiment, the storage circuitry is configured to define the partial verification scheme by defining different first and second partial verification schemes to be used for verifying different respective first and second memory blocks.

There is additionally provided, in accordance with an embodiment that is described herein, a method for data storage, including, in a memory device that includes multiple memory cells that are organized in multiple memory blocks of a nonvolatile memory, defining a partial verification scheme that specifies testing only a data portion of the data programmed to the memory blocks. Data in programmed to a memory block, redundancy data is calculated over the data and the calculated redundancy data is stored in a dedicated memory. The data portion specified for the memory block in the partial verification scheme is verified to have been programmed successfully. A predefined condition is checked for conditionally performing full verification to the memory block. When the predefined condition is fulfilled, data programmed to the memory block and not tested using the partial verification scheme is verified to have been programmed successfully. Using the redundancy data, at least part of the data programmed that failed verification is recovered.

These and other embodiments will be more fully understood from the following detailed description of the embodiments thereof, taken together with the drawings in which:

DETAILED DESCRIPTION OF EMBODIMENTS

Overview

Figure 1:
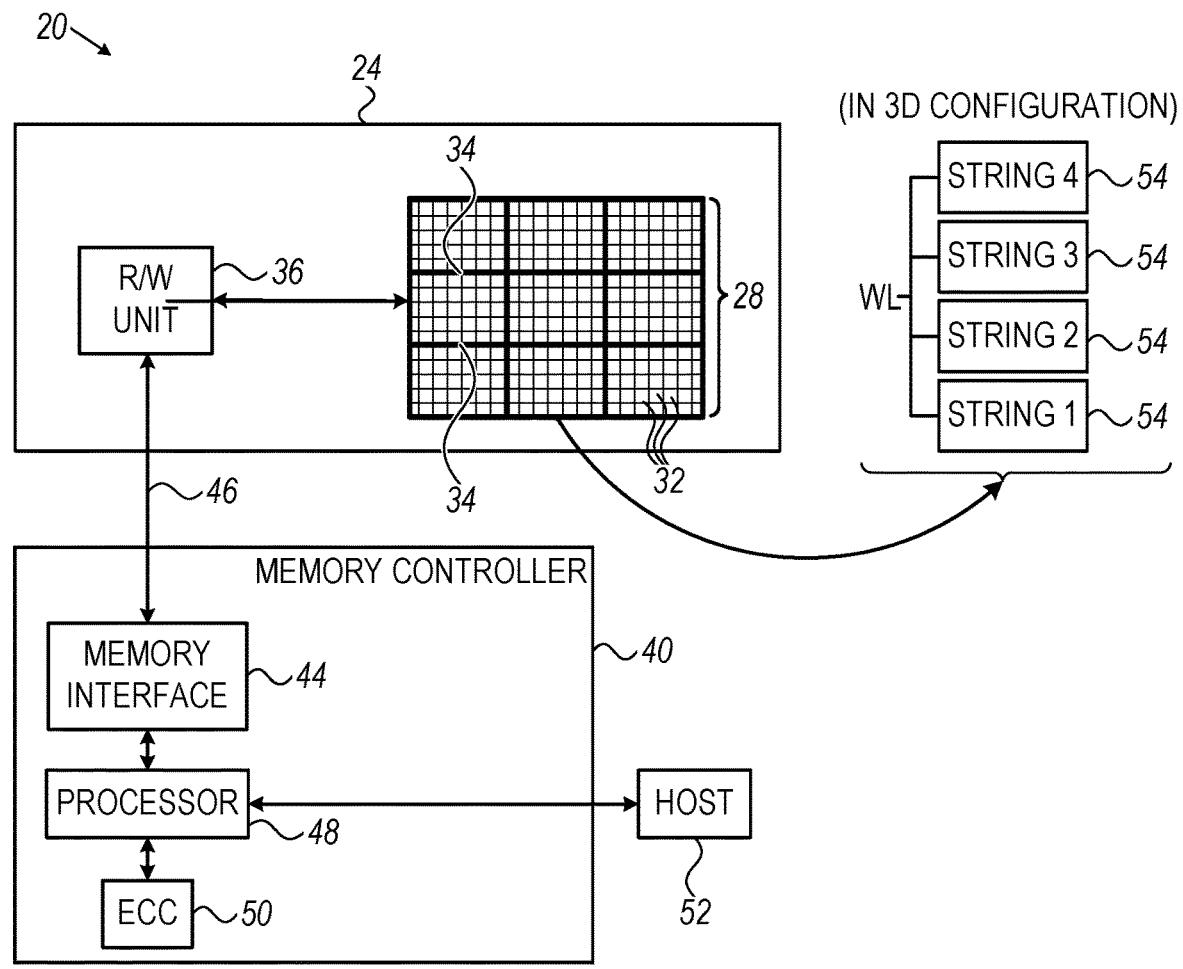
FIG. 1 is a block diagram that schematically illustrates a memory system, in accordance with an embodiment that is described herein.

Programming data to a nonvolatile memory may fail due to various reasons, such as short-circuit or leakage caused at production or during programming. Post programming verification is therefore required for reliable storage.

Embodiments that are described herein provide improved methods and systems for efficient post programming verification. In the disclosed embodiments, a storage device comprises a memory controller that stores data in a nonvolatile memory device comprising memory cells that are organized in multiple memory blocks.

In some embodiments, the memory controller encodes the data prior to programming using a suitable Error Correction Code (ECC), and verifies that the data has been programmed successfully by reading the data from the nonvolatile memory and verifying that the read data decodes successfully using the ECC. To be able to recover corrupted data, the memory controller calculates redundancy data over the data programmed and stores the redundancy data in addition to the data programmed.

For example, the controller calculates a redundancy memory block over a group of multiple memory blocks for recovering one of the memory blocks in the group that has failed. The controller may calculate the redundancy data, and recover failing data based on bit-wise XOR operations or data encoding operations using any suitable encoder such as a Reed-Solomon or Low-Density Parity-Check (LDPC) encoder. The memory controller saves the redundancy data in a dedicated memory, e.g., in the nonvolatile memory device or in a volatile memory external to the nonvolatile such as a Dynamic Random Access Memory (DRAM). The approach of calculating redundancy data for recovering the entire memory block, however, is costly in terms of complexity, latency and power consumption. Moreover, the storage space used for storing the redundancy data can be reused only after verification.

In some disclosed embodiments, the memory controller defines a partial verification scheme that specifies testing only a data portion of the data programmed to the memory blocks. The size of the data portion is typically selected significantly smaller than the size of the full data programmed. In some embodiments, the partial verification scheme is defined based on prior knowledge of storage areas within the memory device that are more sensitive to programming failures than other storage areas.

In applying post programming verification, the memory controller first verifies the data portion specified in the partial verification scheme. The memory controller conditionally performs full verification only when untested programmed data is suspected to be corrupted.

In some embodiments, to evaluate whether full verification is required, the memory controller checks at least one of first and second predefined conditions described herein. In evaluating a first condition, the memory controller measures execution times of erasure and/or programming operations applied to the memory block, calculates a performance metric based on the measured execution times, and decides that full verification is required when the performance metric indicates poor performance. In some embodiments, the controller triggers full verification based on a system level condition, e.g., detecting extreme temperature when programming the memory block.

In evaluating the second condition, the memory controller calculates a likelihood metric that is indicative of the likelihood that at least some of the data programmed to a memory block and not covered by the partial verification scheme has been corrupted. Calculating the likelihood metric involves applying soft decoding to part of the data portion that failed verification, for identifying erroneous bits, classifying the erroneous bits to categories, and calculating the metric based on the distribution of the classified bits among the categories. Upon detecting that the likelihood metric exceeds a predefined likelihood level, the memory controller decides to trigger full verification.

The memory controller recovers corrupted data that failed the partial and/or full verification, using the redundancy data saved prior to programming.

Embodiments for implementing efficient post programming verification will be described in detail below.

In the disclosed techniques, partial verification is typically sufficient, and the memory controller performs full verification only when untested data is highly suspected to be corrupted. This efficient two-stage verification approach results in improved programming throughput and reduced power consumption.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC). A memory device that supports storing multiple bits per cell (e.g., MLC, TLC or QLC mode) can also be used in storing a single bit per cell, i.e., operate in a SLC mode. In some embodiments, storage in SLC mode is more reliable than in MLC or TLC modes, and incurs lower latency in programming.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of memory array 28, R/W unit 36 converts the storage values of memory cells 32 into digital samples having an integer resolution of one or more bits. Data is typically written to and read from the memory cells in data units that are referred to as data pages (or simply pages, for brevity).

For reading a data page, the R/W unit typically sets one or more read thresholds, e.g., at about mid-points between adjacent nominal programming levels, and senses the threshold voltages of the memory cells relative to the read thresholds. The R/W unit can also read the analog values of the memory cells in selected ranges or zones by setting the read thresholds to zone boundaries.

The storage and retrieval of data in and out of memory device 24 is performed by a memory controller 40. Memory controller 40 comprises a memory interface 44 for communicating with memory device 24, a processor 48, and an Error Correcting Code (ECC) unit 50. The memory controller communicates with the memory device via memory interface 44 over a communication link 46. Communication ink 46 may comprise any suitable link or communication bus, such as, for example, a PCIe bus. In some embodiments, the memory controller communicates with the memory device storage commands such as erase, program and read command. The memory controller may communicate with the memory device control commands, e.g., for configuring read thresholds. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. In some embodiments, ECC unit 50 encodes the data for storage using a suitable ECC and decodes the ECC of data retrieved from the memory. ECC unit 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a Code Word (CW).

Data read from a group of memory cells may contain one or more errors. The number of errors typically increases when the read threshold used for sensing the memory cells is positioned non-optimally. In some applications, the ECC supported by ECC unit 50 can be represented by multiple check equations. In some embodiments, the input to the ECC decoder comprises binary data read from the memory cells. Such a decoder is referred to as a "hard decoder." In other embodiments, the input to the ECC comprises soft information, e.g., Log Likelihood Ratio (LLR) metrics, derived by reading the memory cells using multiple different read thresholds at the vicinity of the optimal read threshold. Such an ECC decoder is referred to as a "soft decoder". In some embodiments, ECC unit 50 can be dynamically configured to operate as a hard decoder or soft decoder as required.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or other element of the host system. In some embodiments, host 52 and memory controller 40 may be fabricated on the same die, or on separate dies in the same device package.

In some embodiments, processor 48 of memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In the example of FIG. 1, the memory cells are arranged in a Three-Dimensional (3D) configuration. In such embodiments, the memory cells are arranged in multiple strings 54, wherein each WL comprises memory cells of multiple different strings.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks, also referred to as "memory blocks" 34. In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit significance value would have 256 data pages per erasure block, and three-bit-per-cell devices would have 384 data pages per block. A typical three-dimensional (3D) device that stores three bits per cell may comprise, for example, 4 strings per block, wherein each string comprises several thousand layered columns that each comprises 48 layers of cell columns. Such a 3D device has 12 data pages per a physical word line, or 576 data pages per an erasure block. Alternatively, other block sizes and configurations can also be used.

Errors Caused by Erase Penetration Events

In typical NAND Flash devices, the threshold voltage of erased cells is negative. An event in which the threshold voltage of one or more erased memory cells becomes positive is referred to herein as "erase penetration." Erase penetration may occur due to short-circuit or leakage in the memory device.

Note that the definition of the term "erase penetration" can be extended to embodiments in which the threshold voltages assigned to the erasure level and to the first programming level are not necessarily negative and positive, respectively. In these embodiments, an erase penetration occurs when the threshold voltage of one or more erased memory cells is shifted beyond a position of an optimal read threshold between the erasure level and the next higher programming level.

Erase penetration (as well as other modes of failure) may be caused, for example, by at least one of program disturb, read disturb, and insufficient erasure. In program (or read) disturb, programming (or reading) the memory cells in one WL affects the threshold voltages in memory cells of other WLs in the same memory block. As a result, memory cells that are already programmed to certain respective programming levels may shift toward a neighboring programming level, which may result in read errors. Insufficient erasure is a failure mode in which at least some of the erased memory cells remain having respective threshold voltages too high, and can be falsely read as programmed to a higher programming level. Insufficient erasure may be caused due to incorrect sensing of the memory cells. In case of erase penetration, erased memory cells are shifted to higher threshold voltages and may be falsely interpreted as programmed to a programming level other than the erasure level.

Figure 2:
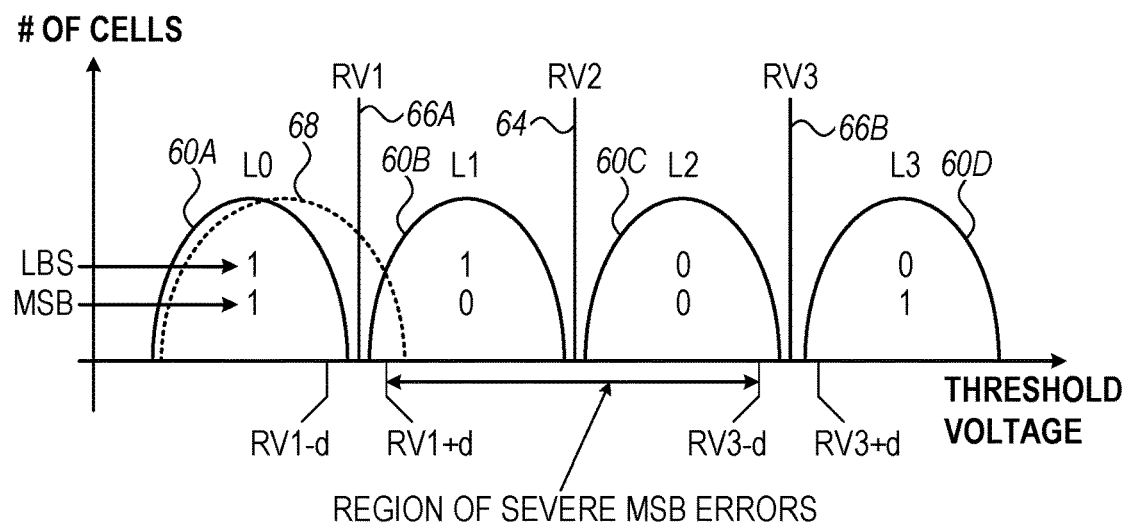
FIG. 2 is a diagram that schematically illustrates threshold voltage distributions in a group of memory cells, wherein some of the erased memory cells read erroneously due to erase penetration, in accordance with an embodiment that is described herein.

FIG. 2 is a diagram that schematically illustrates threshold voltage distributions in a group of memory cells, wherein some of the erased memory cells read erroneously due to erase penetration, in accordance with an embodiment that is described herein. FIG. 2 refers to memory device 24 of memory system 20, configured as a MLC device that stores 2 bits/cell.

Memory controller 40 programs the memory cells of the MLC device, using R/W unit 36, in four respective programming levels denoted L0 . . . L3 corresponding to respective threshold voltage distributions 60A . . . 60D. Each of programming levels L0 . . . L3 corresponds to a pair of bits, i.e., a Least Significant Bit (LSB) and a Most Significant Bit (MSB). In FIG. 2, programming level L0 is assigned to erased memory cells and is associated with (LSB, MSB) bit pair '11'. Additionally, programming levels L1 . . . L3 correspond to (LSB, MSB) bit pairs '10', '00' and '01', respectively.

As noted above, reading the memory cells of memory device 24 typically involves setting one or more read thresholds and sensing the threshold voltages of the memory cells being read. In FIG. 2, a read threshold depicted as a vertical line 64 (denoted RV2) is used for reading LSB data pages, whereas read thresholds depicted as vertical lines 66A and 66B (denoted RV1 and RV3, respectively) are used for reading MSB data pages. Read thresholds RV1−d and RV1+d around RV1, and RV3−d and RV3+d around RV3 ('d' being a positive voltage margin) can be used for applying multiple read operations for generating soft information required for ECC soft decoding, as will be described below.

NVM devices such as memory device 24 are subject to various failures, such as WL-to-substrate and WL-to-WL short-circuit or leakage, and require early detection of such failures in order to avoid data loss. Memory failures of this sort may appear in several failure modes that may occur or develop at different stages of the memory device life cycle. For example, some failures occur during manufacturing processes of the device, while other failures may develop over time and usage during normal operation of the device in a host system. In some embodiments, programming a given WL corrupts data already programmed to the same or other WLs. In FIG. 2, a threshold voltage distribution 68 depicted in dotted line shows the effect of an erase penetration event on the threshold voltage distribution of the erasure level L0.

Consider setting RV1 to its optimal level, typically at some middle threshold voltage between programming levels L0 and L1. In an erase penetration failure mode, erased memory cells whose threshold voltage exceeds RV1 will erroneously read as MSB=0 instead of MSB=1. The threshold voltage of some erased memory cells may even exceed threshold voltage RV1+d. A large number of such memory cells in selected WLs of a memory block may indicate that the data programmed in other WLs of this memory block is likely to be corrupted. Methods in which conditional full verification of a memory block is triggered based on such an indication are described in detail below.

Although the diagram of FIG. 2 focuses on erase penetration failures, the embodiments that will be described below are applicable to other suitable failure modes, such as improper separation of the distributions corresponding to the two highest programming levels L2 and L3, e.g., because of an incomplete programming operation.

Efficient Post Programming Verification Schemes

Figure 3:
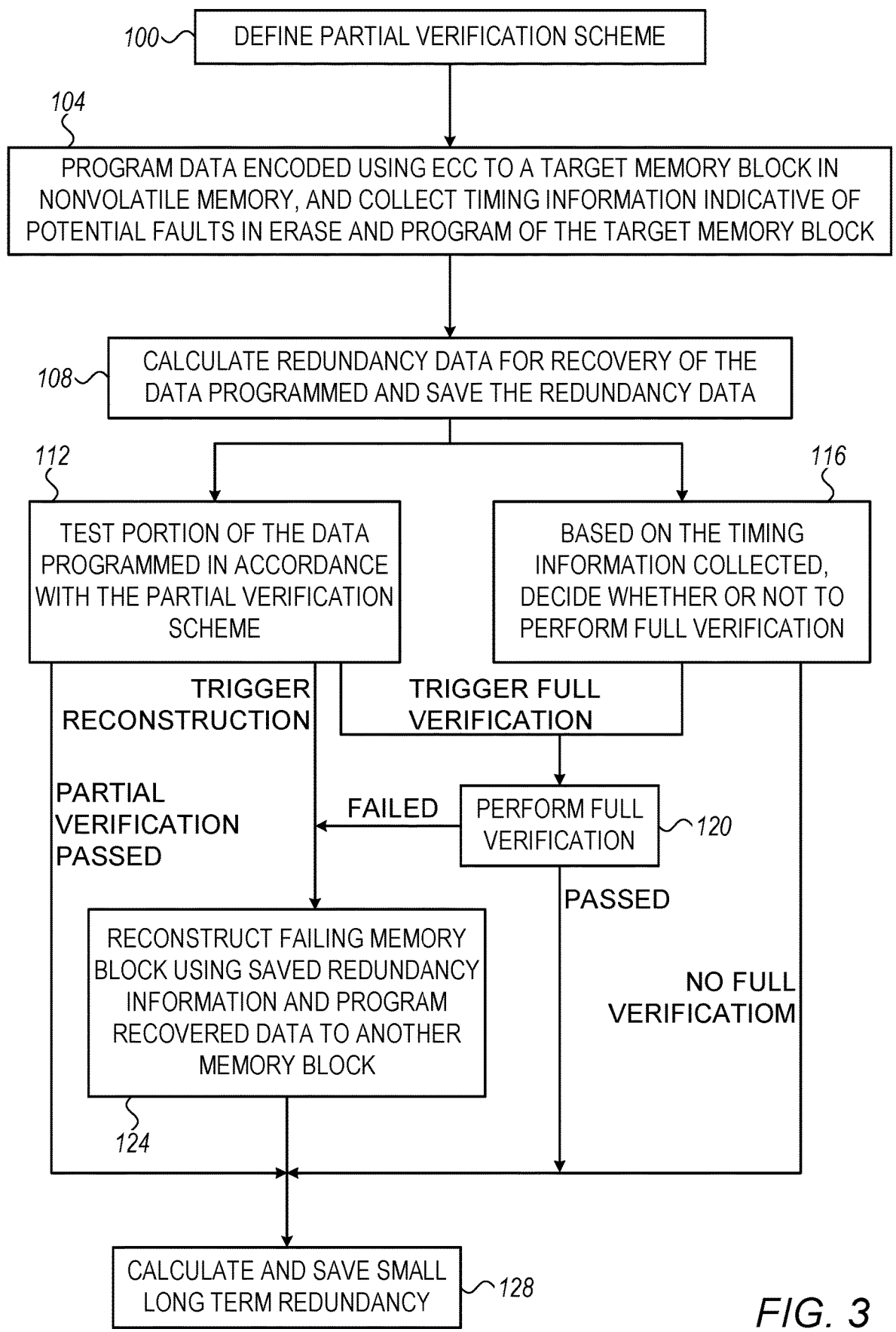
FIG. 3 is a flow chart that schematically illustrates a method for efficient post programming verification, in accordance with an embodiment that is described herein.

FIG. 3 is a flow chart that schematically illustrates a method for efficient post programming verification, in accordance with an embodiment that is described herein. The method of FIG. 3 will be described as being executed by memory controller 40 of memory system 20. Specifically, the method may be executed by processor 48 and ECC 50 of the memory controller. Alternatively, the method can be executed using some suitable partition between memory controller 40 and R/W unit 36 of the underlying memory device.

The method begins with memory controller 40 defining a partial verification scheme, at a verification scheme definition step 100. The partial verification scheme is designed to verify only a small portion of the entire data programmed in each memory block, thus reducing verification time and power consumption, and improving write throughput, significantly. In cases in which the data portion tested is very small relative to the amount of data programmed, the partial verification scheme is also referred to as a "sparse verification scheme."

The partial verification scheme may be defined in various ways, e.g., in accordance with different tradeoff goals between efficiency and miss-detection of failures not covered by the partial verification scheme. Table 1 below summarizes several example partial verification schemes. The partial verification schemes in Table 1 are applicable, for example, to a MLC memory device having a 3D configuration, wherein each memory block comprises four strings, each of which comprises a number M of WLs. In the present example, each WL stores LSB data and MSB data in respective LSB and MSB data pages, and each data page comprises four Code Words (CWs) of encoded data, that was encoded, e.g., using ECC 50.

TABLE 1

Example partial verification schemes

| Scheme | strings | WLs | Data/WL | Efficiency factor |
|---|---|---|---|---|
| S1 | all | all | MSB page only | 2 |
| S2 | One out of 4 | all | MSB page only | 4 · 2 = 8 |
| S3 | One out of 4 | all | One CW out of 4 per MSB data page | 4 · 2 · 4 = 32 |
| S4 | all | N out of M | MSB page only | 2 · N/M |

In partial verification scheme S1, the memory controller verifies all MSB data pages and skips verifying all LSB data pages, resulting in an efficiency factor of 2. Partial verification scheme S2 is a variant of scheme S1, in which the memory controller verifies only one out of four strings per memory block, resulting in an efficiency factor of 8. Partial verification scheme S3 is a variant of scheme S2, in which the memory controller verifies only one ECC CW per MSB data page, resulting in an efficiency factor of 32. Scheme S4 in Table 1 is a partial verification scheme, in which the memory controller verifies MSB data pages in only N out of M WLs per string. For example, in an embodiment, the memory controller verifies one or more WLs per string, e.g., four WLs per string. In an embodiment, the WL to be verified are located at the edges of the memory block, because WL-to-WL shot circuit and/or leakage is likely to occur in WL closer to the memory block edge due to NAND process and program disturb. In this case the efficiency factor is 2·M/N.

In some embodiments, the verification scheme defines a common testing pattern to be used for all of the memory blocks of the memory device. In other embodiments, different verification patterns may be configured to different memory blocks. For example, in an embodiment, the verification pattern depends on the actual storage mode used for the memory block such as SLC mode or TLC mode. As another example, memory blocks that store sensitive data such as booting information may require more extensive verification than other memory blocks and are therefore assigned an extensive partial verification scheme. As another example, a verification scheme may depend on the physical location of the memory block within the memory device.

In some embodiments, certain memory blocks may be more sensitive to programming failures than others, and therefore require more extensive verification. The sensitivity of memory blocks to programming failures may depend on the memory device topology. Identifying sensitive memory blocks may be carried out offline using field tests over a large ensemble of memory devices. Although the example partial verification schemes shown in Table 1 above employ regular testing patterns, this is not mandatory. In alternative embodiments, any non-regular testing pattern, such as a random testing pattern can also be used. For example, the memory controller may determine the actual partial verification scheme at power up time.

At a programming step 104, the memory controller programs data to a target memory block. Prior to programming, the memory controller encodes the data using ECC 50, and sends the encoded data for programming in the memory device using suitable write command(s). In some embodiments, the memory controller sends for programming an amount of data suitable for programming one WL or less at a time.

In an embodiment, during the erasure and programming of the target memory block, the memory controller monitors and collects timing information regarding the erasure and programming operations. For example, an erasure or programming operation that takes a long time may indicate that this operation has taken a large number of erasure or programming pulses to complete, which may disturb the threshold voltages of memory cells in other WLs.

At a redundancy calculation step 108, the memory controller calculates redundancy data for the target memory block, and saves the redundancy data in a dedicated memory, e.g., a local memory of the memory system such as a Dynamic Random Access Memory (DRAM, not shown). Alternatively, the memory controller stores the redundancy data in the nonvolatile memory, e.g., using SLC mode for increased speed and reliability. The memory controller calculates redundancy data that can be used for recovering any pattern of data corruption in the target memory block.

The memory controller calculates the redundancy data using any suitable method, such as by applying any suitable recovery scheme, e.g., over a group of memory blocks that includes the target memory block. In an embodiment, the memory controller calculates the redundancy data by applying bit-wise XOR operations among data pages in the memory blocks of the group, or using any suitable encoding method such as Reed-Solomon or Low-Density Parity-Check (LDPC) encoding.

At a partial verification step 112, the memory controller reads the data programmed from the target memory block, in accordance with the verification scheme defined at step 100. For example, in case of using partial verification scheme S1 of Table 1 above, the memory controller reads from the memory block only MSB data. In the present example, the partial verification may result in one of the following outcomes: (i) partial verification passed, which means that the memory block is verified to be programmed correctly with high probability, (ii) data programmed to the memory block is suspected to be corrupted and requires full verification and (iii) the partial verification has failed and therefore the memory block needs to be recovered using the redundancy data. In some embodiments, the memory controller makes the decision at step 112, by calculating a suitable metric, as will be described below. A method for performing partial verification will be described in detail with reference to FIG. 4 below.

At a timing-based verification step 116, the memory controller checks whether full verification of the target memory block is required, based on the timing information monitored and collected at step 104 above. In some embodiments, the memory controller calculates a performance metric based on the erasure/programming execution times measured, and triggers full verification to the target memory block when the performance metric indicates poor performance.

In some embodiments, calculating the performance metric is based on measured block erasure times and/or programming times of one or more WLs in the memory block. In an embodiment the memory controller calculates a suitable function over multiple time measurements such as, for example, a minimal value, a maximal value, an average or standard deviation value of the measured times, or a combination of one or more of such functions. The memory controller triggers full verification when the performance metric indicates poor performance, e.g., when the value of the performance metric exceeds a predefined maximal value.

In some embodiments, the memory controller decides to trigger full verification based on at least one of (i) the method based on partial verification of step 112, and (ii) the method based on the timing information at step 116. For example, the memory controller makes a combined decision by weighting the metrics or decisions produced at steps 112 and 116, using suitable predefined weights. Alternatively, the memory controller may perform full verification and/or block reconstruction based on a decision taken only at one of steps 112 and 116.

In some embodiments, the memory controller triggers full verification in accordance with some system level condition. For example, the memory controller monitors the environmental or die temperature, and triggers full verification upon detecting that programming the memory block occurs at an extreme high or low temperature.

At a full verification step 120, triggered by step 112, 116 or both, as described above, the memory controller verifies the data programmed to the target memory block, by checking that the programmed data is decodable successfully using ECC 50. In some embodiments, the memory controller performs full verification by checking whether the data is decodable using ECC hard decoding, and when hard decoding fails, rechecking using soft decoding. This scheme is not mandatory and any other suitable method for full verification can also be used.

When the partial verification test of step 112 triggers reconstruction of the target memory block, or when the full verification check of step 120 fails, i.e., at least one data page or WL fails ECC soft decoding, the memory controller proceeds to a reconstruction step 124. At step 124, the memory controller uses the redundancy data stored at step 108 in recovering the data programmed to the target memory block, e.g., in accordance with the recovery scheme of step 108. The memory controller programs the recovered data to another physical memory block of the memory device.

Following block reconstruction at step 124, or when the partial verification of step 112 or the full verification of step 120 has passed successfully, the memory controller proceeds to a long term redundancy calculation step 128. At step 128, the memory block is successfully verified or reconstructed, and the memory controller calculates for the memory block long term redundancy data that is typically much smaller than the redundancy data calculated at step 108. The long term redundancy data typically protects against failure modes that are likely to occur during data storage, such as several WLs failing in the same memory block, and/or a single WL that fails in multiple memory blocks across multiple respective planes. Example recovery schemes that can be used for long term storage are described, for example, in U.S. Pat. No. 9,996,417, whose disclosure is incorporated herein by reference.

Following step 128, the method of FIG. 3 terminates.

In some embodiments, the memory controller defines the partial verification scheme as a sequence of multiple partial verification schemes, and applies the partial verification schemes in accordance with the sequence order as long as verification fails. The multiple partial verification schemes are designed to test different respective portions of the data programmed. For example, the memory controller may define a sequence of partial verification schemes {S3, S2', S1'} based on the verification schemes in Table 1 above. In this example, verification scheme S2' covers a data portion of S2 that is not covered by S3, and S1' covers a data portion of S1 that is not covered by both S3 and S2. When verification using one of the partial verification schemes fails, and the metric (calculated e.g., at step 112) indicates possible corrupted data not covered by current and previously applied partial verification schemes, the memory controller performs subsequent verification using the next verification scheme in the sequence.

Figure 4:
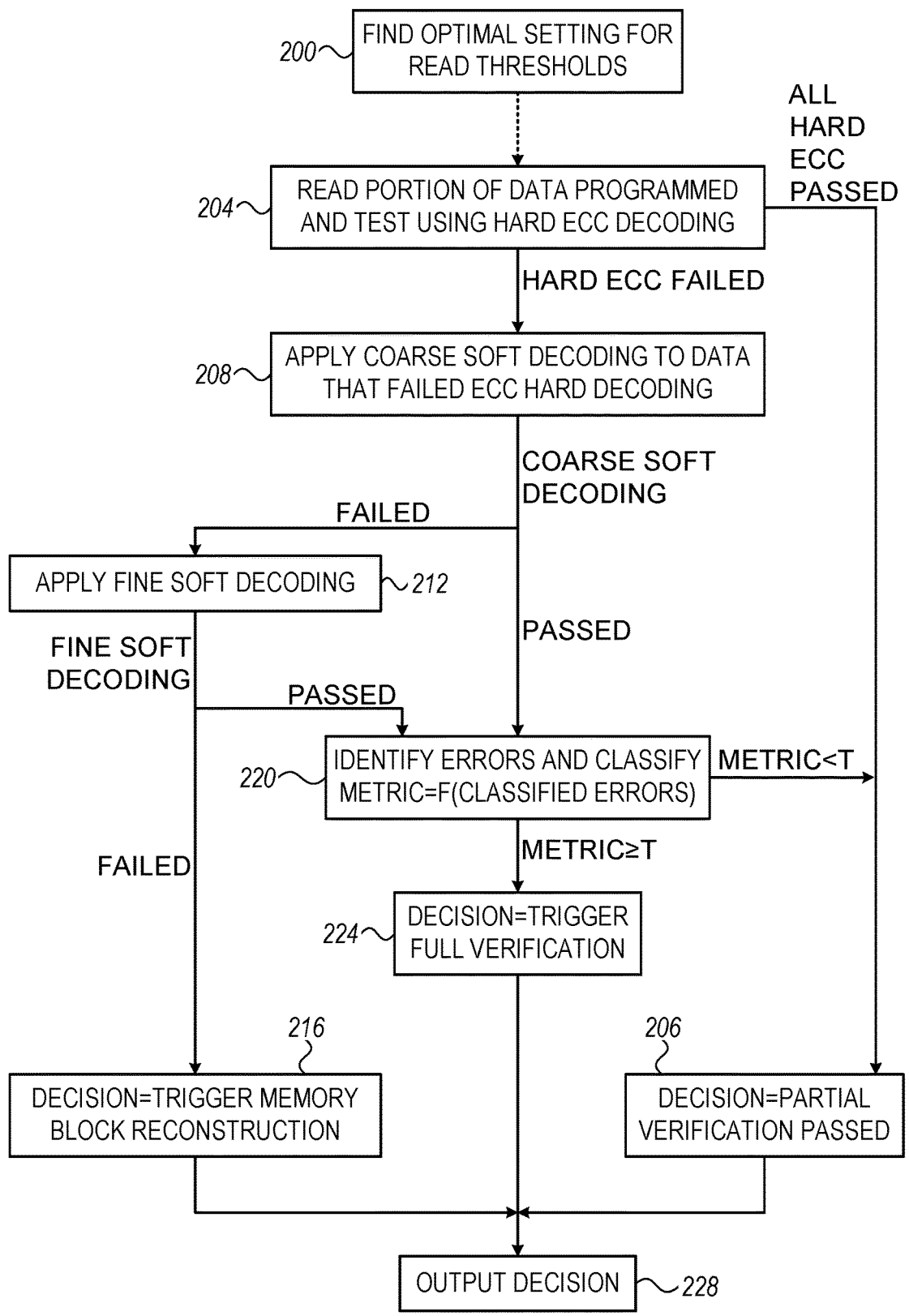
FIG. 4 is a flow chart that schematically illustrates a method for partial verification, in accordance with an embodiment that is described herein.

FIG. 4 is a flow chart that schematically illustrates a method for partial verification, in accordance with an embodiment that is described herein. The method will be described as being executed by memory controller 40 of memory system 20. The memory controller may execute the method, for example, in implementing step 112 of the method of FIG. 3. We further assume that memory device 24 is a MLC device that stores LSB and MSB data pages.

In general, the method may be executed by processor and ECC 50 of the memory controller. Alternatively, the method can be executed using some suitable partition between memory controller 40 and R/W unit 36 of the underlying memory device.

The method begins with memory controller 40 finding optimal settings for read thresholds, at an acquisition step 200. In the present example, with reference to FIG. 2, the memory controller finds optimal settings for RV1 and RV3 for reading MSB data. In some embodiments, the memory controller selects the optimal read thresholds using an optimality criterion that aims to minimize reading errors. The memory controller may use any suitable method for optimal setting of the read thresholds. For example, in an embodiment, the memory controller performs multiple read operations using different candidate configurations of read thresholds, and selects the candidate configuration that achieves a minimal error rate. The memory controller typically executes step 200 at the beginning of life, and occasionally during the lifetime of the memory device, as required.

At a hard decoding step 204, the memory controller reads a portion of the data programmed to the memory block using the optimal read thresholds found at step 200. The memory controller selects the portion of the data to be tested in accordance with the underlying partial verification scheme, e.g., as defined at step 100 of FIG. 3. For example, when using partial verification scheme S1 of Table 1, the memory controller reads the MSB data using the read thresholds RV1 and RV3, which were set optimally, e.g., at step 200.

The memory controller applies to the portion of the data read ECC hard decoding using ECC 50, e.g., at a data page level or WL level. When the entire data tested using the partial verification scheme decodes successfully using the ECC hard decoding, the memory block is considered as programmed correctly, with high probability, and the memory controller proceeds to a successful verification decision step 206, to set a decision variable to indicate that the partial verification has passed.

Otherwise, hard decoding of one or more data pages has failed, and the memory controller proceeds to a coarse soft decoding step 208, at which the memory controller applies coarse ECC soft decoding to the data that failed ECC hard decoding at step 204. The memory controller may use any suitable soft decoding method. For example, the memory controller reads the MSB data using multiple read thresholds, to produce multiple respective read outcomes. In an embodiment, in coarse soft decoding, the memory controller performs a small number of read operations using multiple read thresholds such as RV1-$d$ and RV1+$d$ around the optimal RV1, and RV3-3 and RV3+$d$ around optimal RV3 of FIG. 2. Based on the multiple read outcomes, the memory controller calculates soft information such as Log Likelihood Ratio (LLR) metrics, and decodes the MSB data using the soft information.

When at least one of the decoding operations applied in the coarse soft decoding fails, the memory controller applies a fine soft decoding at a fine soft decoding step 212. At step 212, the memory controller applies a soft decoding method to the failing data similar to the coarse soft decoding method of step 208, but based on reading the failing MSB data using a larger number of read thresholds, which increases the probability of successful soft decoding.

When the fine soft decoding fails, at least some of the portion of data tested is corrupted, and the memory controller sets the decision variable to indicate that memory block reconstruction is required, at a reconstruction decision step 216.

When either coarse soft decoding at step 208 or fine soft decoding at step 212 passes, some of the data in memory block that was not covered by the partial verification scheme may still be corrupted, and the memory controller proceeds to a metric calculation step 220.

At step 220, the memory controller calculates a metric that is indicative of the likelihood that at least some of the data programmed to the memory block but not covered by the partial verification scheme may be corrupted. The memory controller compares the metric value to a predefined threshold T. When the metric value is below T, the data not covered by the partial verification test is assumed to be programmed correctly, with high probability, and the memory controller sets the decision variable to indicate that partial verification has passed, at step 206. Otherwise, partial verification has failed, and the memory controller sets the decision variable to indicate that full verification is required, at a full verification decision step 224.

In general, the type of metric used and the predefined threshold T should be selected and tuned so as to (i) minimize the rate of failing to trigger full verification when untested data is actually corrupted, and (ii) minimize the rate of falsely triggering full verification when the untested data has been programmed correctly.

Following each of steps 206, 216 and 224, the memory controller outputs the decision variable at an output step 228, and the method terminates.

Although in the method of FIG. 2, the memory controller first applies coarse soft decoding and then fine soft decoding (when the coarse soft decoding fails) such a soft decoding is not mandatory. In alternative embodiments, the memory controller may perform only coarse soft decoding or fine soft decoding for deciding whether full verification or memory block reconstruction is required.

The memory controller may calculate the metric at step 220 in various ways. For example, using the coarse and/or fine soft decoding techniques described above, the memory controller identifies bits that were read erroneously, and classifies these erroneous bits into multiple severity categories. Identifying the erroneous bits is possible because soft decoding has succeeded and therefore the actual data that was received to be programmed is now known.

In some embodiments, the memory controller calculates the metric based on the distribution of the erroneous bits among the severity categories. For example, the memory controller calculates the metric as a weighted sum of the numbers of erroneous bits in the respective severity categories. In some embodiments, categories of higher severity are assigned higher weights, and vice versa. In some embodiments, the memory controller calculates the metric based on the overall bit error-rate and on the error-rate of the erroneous bits classified as severe errors.

The memory controller may apply the classification into severity categories and calculate the metric value in various ways. For example, with reference to FIG. 2, the memory controller classifies erroneous bits corresponding to ranges of threshold voltages between RV1 and RV1+$d$, and above RV1+$d$, as having normal severity and high severity, respectively. The memory controller calculates the metric based on the classified erroneous bits. In an example embodiment, the memory controller sets the metric value to the number erroneous bits classified to the most severe category. In this case, the more severe errors detected, the higher the likelihood that at least some of the data programmed but not tested using the partial verification scheme is corrupted, and therefore full verification should be triggered.

The embodiments described above are given by way of example, and other suitable embodiments can also be used. For example, although the embodiments above refer mainly to a 3D MLC device, these embodiments are similarly applicable to 2D devices, and to memory devices with storage capacity other than 2 bits/cell.

Although the methods of FIGS. 3 and 4 are partitioned so that the method of FIG. 4 provides decisions to the calling method of FIG. 3, other suitable partitions can also be used. In alternative embodiments, the method of FIG. 4 provides metric values that are used by the method of FIG. 3 to make the decisions based on the metrics.

Although the embodiments describe above refer mainly to programming failures causing erase penetration, the disclosed embodiments are also applicable to any other programming failures that may occur in the memory device.

Although the embodiments described herein mainly address a memory system comprising a controller and a nonvolatile memory, the methods and systems described herein can also be used in other applications, such as in various configurations of storage systems as well as other applications that employ at least a nonvolatile memory.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage device, comprising:
multiple memory cells organized in multiple memory blocks of a nonvolatile memory; and
storage circuitry, configured to:
store a definition of a partial verification scheme that specifies verifying successful programming of only a data portion of data programmed to a memory block;
store a definition of a full verification scheme that specifies verifying successful programming of data that was programmed to a memory block and that was not verified using the partial verification scheme;
program data to a memory block, calculate redundancy data over the data, and save the calculated redundancy data in a dedicated memory;
verify that the data portion specified for the memory block in the partial verification scheme has been programmed successfully;
check a predefined condition for conditionally performing the full verification scheme to the memory block;
based on a determination that the predefined condition is fulfilled, perform the full verification scheme to the memory block; and
based on a determination that verifying the memory block using the full verification scheme has failed, recover, using the redundancy data, at least part of the data programmed to the memory block.

2. The storage device according to claim 1, wherein to define the partial verification scheme, the storage circuitry is configured to exclude from testing data programmed to at least one of: a Word Line (WL) of the memory cells, a data page of a given bit significance, a string in a Three Dimensional (3D) configuration of the memory cells, and a Code Word calculated prior to programming using an Error Correction Code (ECC).

3. The storage device according to claim 1, wherein the storage circuitry is configured to encode the data prior to programming in accordance with a predefined ECC, and wherein to verify that the data has been programmed successfully, the storage circuitry is configured to read the programmed data and to verify that the read data decodes successfully in accordance with the predefined ECC.

4. The storage device according to claim 1, wherein to check the predefined condition, the storage circuitry is configured to measure execution times of at least one of erasure and programming operations applied to the memory block, to calculate a performance metric based on the measured execution times, and to decide that the condition is fulfilled when the performance metric exceeds a predefined performance threshold.

5. The storage device according to claim 1, wherein to check the predefined condition, the storage circuitry is configured to calculate a likelihood metric indicative of a likelihood that at least some of the data programmed to the memory block that is not specified within the data portion has been corrupted, and to decide that the condition is fulfilled when the likelihood metric exceeds a predefined likelihood level.

6. The storage device according to claim 5, wherein to calculate the likelihood metric, the storage circuitry is configured to identify erroneous bits in the data portion, to classify the erroneous bits to multiple severity categories, and to calculate a likelihood metric based on a distribution of the erroneous bits among the severity categories.

7. The storage device according to claim 6, wherein to calculate the likelihood metric, the storage circuitry is configured to evaluate error counts of the erroneous bits in the respective severity categories, and to calculate a weighted sum of the error counts using predefined weights assigned respectively to the severity categories.

8. The storage device according to claim 6, wherein to identify the erroneous bits, the storage circuitry is configured to read the data portion using multiple read thresholds to produce multiple respective read outcomes, and to apply soft decoding to the data portion using soft information derived from the multiple read outcomes.

9. The storage device according to claim 6, wherein to identify the erroneous bits, the storage circuitry is configured to apply coarse soft decoding to at least part of the data portion based on a first number of read outcomes, and based on a determination that the coarse soft decoding has failed, to apply fine soft decoding to the at least part of the data portion based on a second number of read outcomes larger than the first number.

10. The storage device according to claim 6, wherein the storage circuitry is configured to identify at least some of the erroneous bits, wherein to identify the at least some of the erroneous bits, the storage circuitry is configured to erase memory cells whose threshold voltages exceed a predefined threshold voltage.

11. The storage device according to claim 1, wherein to define the partial verification scheme, the storage circuitry is configured to define different first and second partial verification schemes to be used for verifying different respective first and second memory blocks.

12. A method for data storage, comprising:
- in a memory device comprising multiple memory cells that are organized in multiple memory blocks of a nonvolatile memory, storing a definition of a partial verification scheme that specifies verifying successful programming of only a data portion of data programmed to a memory block, and storing a definition of a full verification scheme that specifies verifying successful programming of data that was programmed to a memory block and that was not verified using the partial verification scheme;
- programming data to a memory block, calculating redundancy data over the data and saving the calculated redundancy data in a dedicated memory;
- verifying that the data portion specified for the memory block in the partial verification scheme has been programmed successfully;
- checking a predefined condition for conditionally performing the full verification scheme to the memory block;
- based on a determination that the predefined condition is fulfilled, performing the full verification scheme to the memory block; and
- based on a determination that verifying the memory block using the full verification scheme has failed, recovering, using the redundancy data, at least part of the data programmed to the memory block.

13. The method according to claim 12, wherein defining the partial verification scheme comprises excluding from testing data programmed to at least one of: a Word Line (WL) of the memory cells, a data page of a given bit significance, a string in a Three Dimensional (3D) configuration of the memory cells, and a Code Word calculated prior to programming using an Error Correction Code (ECC).

14. The method to claim 12, wherein programming the data comprises encoding the data prior to programming in accordance with a predefined ECC, and verifying that the data has been programmed successfully by reading the programmed data and verifying that the read data decodes successfully in accordance with the predefined ECC.

15. The method according to claim 12, wherein checking the predefined condition comprises measuring execution times of at least one of erasure and programming operations applied to the memory block, calculating a performance metric based on the measured execution times, and deciding that the condition is fulfilled when the performance metric exceeds a predefined performance threshold.

16. The method according to claim 12, wherein checking the predefined condition comprises calculating a likelihood metric indicative of a likelihood that at least some of the data programmed to the memory block that is not specified within the data portion has been corrupted, and deciding that the predefined condition is fulfilled when the likelihood metric exceeds a predefined likelihood level.

17. The method according to claim 16, wherein calculating the likelihood metric comprises identifying erroneous bits in the data portion, classifying the erroneous bits to multiple severity categories, and calculating a likelihood metric based on a distribution of the erroneous bits among the severity categories.

18. The method according to claim 17, wherein calculating the likelihood metric comprises evaluating error counts of the erroneous bits in the respective severity categories, and calculating a weighted sum of the error counts using predefined weights assigned respectively to the severity categories.

19. The method according to claim 17, wherein identifying the erroneous bits comprises applying coarse soft decoding to at least part of the data portion based on a first number of read outcomes, and based on a determination that the coarse soft decoding fails, applying fine soft decoding to the at least part of the data portion based on a second number of read outcomes larger than the first number.

20. The method according to claim 17, wherein identifying the erroneous bits comprises identifying at least some of the erroneous bits by identifying erased memory cells whose threshold voltages exceed a predefined threshold voltage.

* * * * *